United States Patent
Tobise

(10) Patent No.: US 8,097,893 B2
(45) Date of Patent: Jan. 17, 2012

(54) LIGHT EMITTING DEVICE

(75) Inventor: Manabu Tobise, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 170 days.

(21) Appl. No.: 12/497,726

(22) Filed: Jul. 6, 2009

(65) Prior Publication Data

US 2010/0012961 A1    Jan. 21, 2010

(30) Foreign Application Priority Data

Jul. 15, 2008  (JP) ................................. 2008-183747
Feb. 16, 2009  (JP) ................................. 2009-032837

(51) Int. Cl.
*H01L 33/54* (2010.01)
*H01L 33/56* (2010.01)

(52) U.S. Cl. ................................. 257/98; 257/E33.059

(58) Field of Classification Search .............. 257/98, 257/E33.059
See application file for complete search history.

(56) References Cited

U.S. PATENT DOCUMENTS

| | | | | |
|---|---|---|---|---|
| 7,834,539 B2* | 11/2010 | Handa et al. | ......... | 313/503 |
| 7,834,541 B2* | 11/2010 | Cok | ......... | 313/504 |
| 7,902,748 B2* | 3/2011 | Cok | ......... | 313/506 |
| 7,936,122 B2* | 5/2011 | Izumi et al. | ......... | 313/504 |
| 2007/0114925 A1 | 5/2007 | Cok | | |
| 2007/0200496 A1 | 8/2007 | Cok et al. | | |
| 2008/0297045 A1* | 12/2008 | Cok | ......... | 313/506 |
| 2009/0001883 A1* | 1/2009 | Fiebranz | ......... | 313/504 |
| 2011/0024779 A1* | 2/2011 | Nakamura et al. | ......... | 257/98 |

FOREIGN PATENT DOCUMENTS

| | | |
|---|---|---|
| JP | 2004-109497 A | 4/2004 |
| JP | 2007-265988 A | 10/2007 |
| WO | 2006/035956 A1 | 4/2006 |
| WO | 2007/076913 A1 | 7/2007 |
| WO | WO 2010/122913 A1 * | 10/2010 |

OTHER PUBLICATIONS

Corresponding EPO The extended European Search Report dated Dec. 17, 2009.

* cited by examiner

*Primary Examiner* — Evan Pert
(74) *Attorney, Agent, or Firm* — SOLARIS Intellectual Property Group, PLLC

(57) ABSTRACT

A light emitting device 10 has a supporting substrate 12; a first electrode 14 disposed on the supporting substrate; an electroluminescent layer disposed on the first electrode and including at least a light emitting layer 16; a second electrode 18 disposed opposite to the first electrode, with the electroluminescent layer being interposed therebetween; a resin layer 20 disposed on the second electrode directly or with an intermediate layer interposed therebetween, or on a surface of the supporting substrate at the opposite side of a surface where the first electrode is disposed; and light transmitting particles 22 scattered in the resin layer, and at least a portion of the light transmitting particles are scattered in the resin layer such that a part of each of the scattered particles is embedded in a surface of the resin layer at the side at which light is extracted from the light emitting layer.

5 Claims, 13 Drawing Sheets

US 8,097,893 B2

LIGHT EMITTING DEVICE

CROSS REFERENCE TO RELATED APPLICATION

This application claims priority under 35USC 119 from Japanese Patent Application No. 2008-183747 filed on Jul. 15, 2008 and Japanese Patent Application No. 2009-032837 filed on Feb. 16, 2009, the disclosures of which are incorporated herein by reference.

BACKGROUND OF THE INVENTION

1. Field of the Invention

The present invention relates to a light emitting device and a method for producing the same.

2. Description of the Related Art

In recent years, light emitting devices utilizing electroluminescence (EL) elements have been developed. For example, in a light emitting device utilizing an organic EL element, a first electrode, an organic EL layer including at least a light emitting layer, and a second electrode are sequentially laminated on a supporting substrate such as glass, and the organic EL element is sealed with a sealing substrate such as glass, in order to protect the organic EL element from the oxygen or moisture in the atmosphere. When the light emitting device is connected to external lines through the lead-out lines (terminals) of the two electrodes, and an electric field is applied, the holes and electrons recombine in the light emitting layer in the region interposed between the electrodes, and thereby light is emitted. A bottom emission light emitting device in which the light generated in the light emitting layer is extracted through the supporting substrate side and a top emission light emitting device in which the light is extracted through the sealing substrate side are known.

As the substrate to be used in EL displays and the like, a resin sheet in which, for example, in an epoxy resin layer, a light diffusing material having a refractive index different from that of the epoxy resin is unevenly distributed so as to have a concentration distribution in the thickness direction has been proposed (see Japanese Patent Application Laid-Open (JP-A) No. 2004-109497).

Also, in order to enhance the efficiency of extracting light in a top emission light emitting device, a method has been proposed in which a structure having a three-dimensional shape and formed from a resin material is provided on the second electrode by the imprint technology, and the light which is totally reflected between the second electrode and the air is made to enter the structure, to thereby extract light to the outside from the lateral surface of the structure (see JP-A No. 2007-265988).

SUMMARY OF THE INVENTION

It is an object of the present invention to provide a light emitting device which is easy to produce and is capable of effectively enhancing the light extraction efficiency, and a method for producing the same.

The invention has been made in view of the above circumstances, and provides a light emitting device and a method for producing the same as described below.

According to a first aspect of the invention, a light emitting device is provided, which includes:

a supporting substrate;

a first electrode disposed on the supporting substrate;

an electroluminescent layer disposed on the first electrode and including at least a light emitting layer;

a second electrode disposed opposite to the first electrode, with the electroluminescent layer interposed therebetween;

a resin layer disposed on the second electrode directly or with an intermediate layer interposed therebetween, or on a surface of the supporting substrate at the opposite side of a surface where the first electrode is disposed; and light transmitting particles scattered in the resin layer, at least a portion of the light transmitting particles being scattered such that a part of each of the scattered particles is embedded in a surface of the resin layer at the side at which light is extracted from the light emitting layer.

According to a second aspect of the invention, a method for producing a light emitting device is provided, which includes:

forming at least a first electrode, an electroluminescent layer including a light emitting layer, and a second electrode in this order on a supporting substrate;

disposing a resin layer in a semi-cured state, on the second electrode directly or with an intermediate layer interposed therebetween, or on the surface of the supporting substrate on the opposite side of a surface where the first electrode is disposed;

implanting light transmitting particles into the resin layer in a semi-cured state by gas flow conveyance, such that at least a portion of the light transmitting particles are partially embedded in the resin layer; and further curing the resin layer in a semi-cured state after implanting the light transmitting particles into the resin layer.

DETAILED DESCRIPTION OF THE INVENTION

Hereinafter, a light emitting device according to the present invention and a method for producing the same will be described, while making reference to the attached drawings.

Figure 4A:
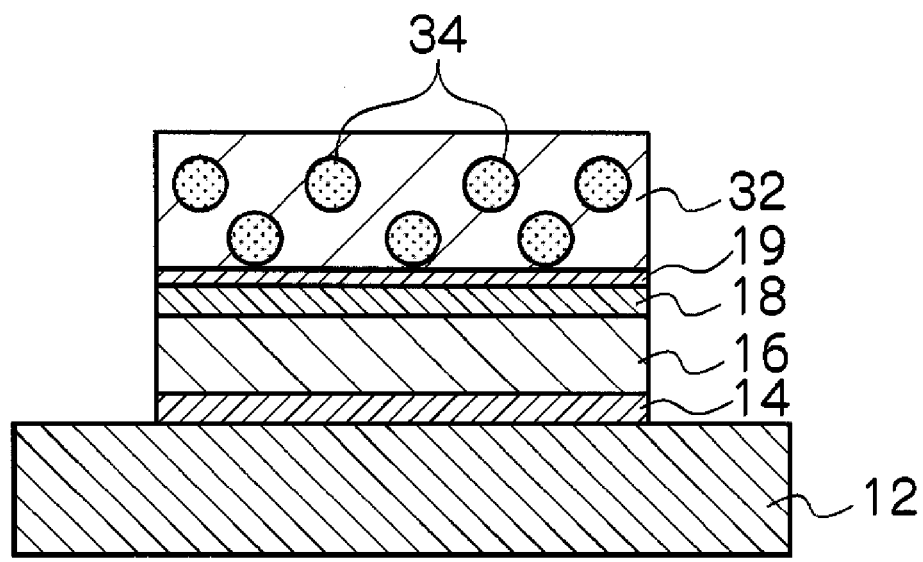
FIG. 4A is a schematic diagram showing an example configuration of conventional organic EL light emitting devices.
Figure 4B:
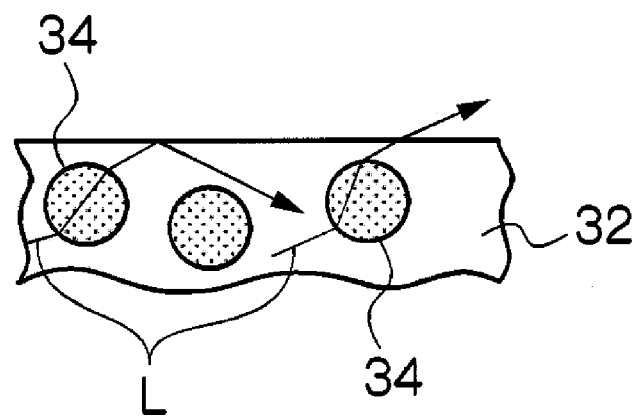
FIG. 4B is a schematic diagram modeling the light path of the organic EL light emitting device shown in FIG. 4A.

In a top emission type light emitting device, for example, as shown in FIG. 4, if a resin layer 32 having a particulate light diffusing materials 34 embedded therein is provided at the side of light extraction, the light path changes as light L from the light emitting layer 16 enters the particle, as shown in FIG. 4B. However, since the light L passes through the particle 34 and then comes out again into the resin layer 32, it is difficult for the light to come out from the resin layer 32, and the light extraction efficiency is difficult to improve.

Figure 5A:
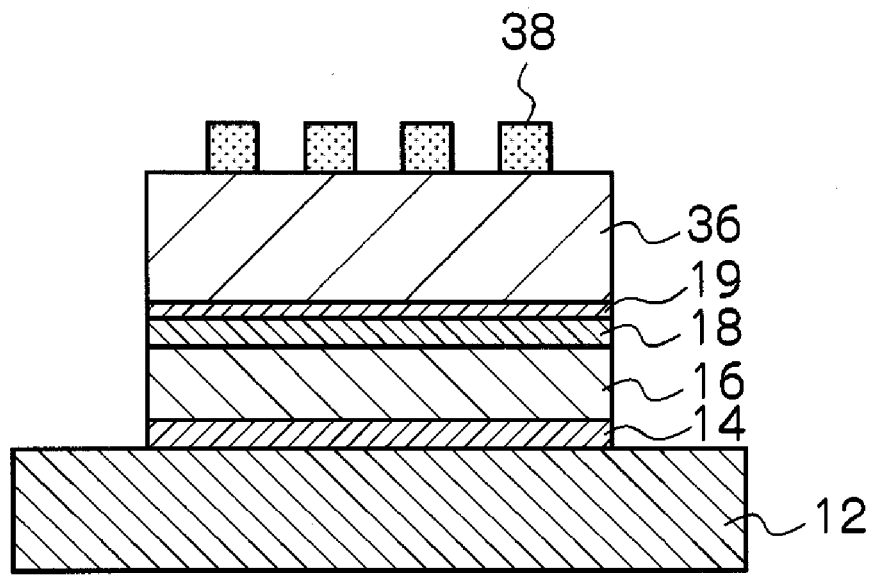
FIG. 5A is a schematic diagram showing another example configuration of conventional organic EL light emitting devices.
Figure 5B:
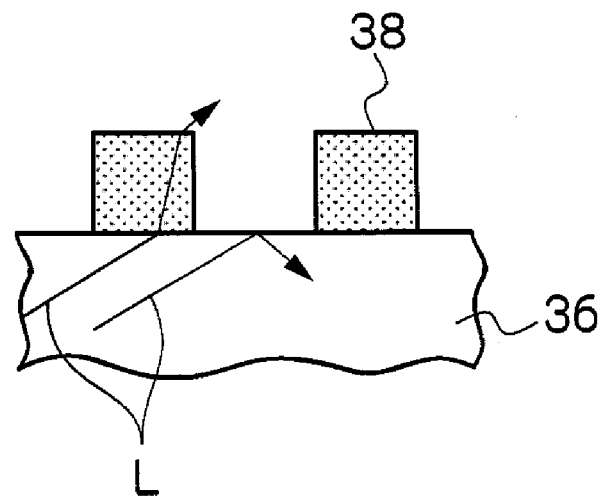
FIG. 5B is a schematic diagram modeling the light path of the organic EL light emitting device shown in FIG. 5A.

Furthermore, as shown in FIG. 5A, in the case where a rectangular solid structure 38 is provided on a sealing layer 36, even if the light L from the light emitting layer reaches the surface of the resin layer 36, the light is likely to return into the second electrode 18 by being reflected again in the region where the structure 38 does not exist on the surface, and it is difficult to sufficiently improve the light extraction efficiency. Further, if a structure 38 is formed in a uniform shape by, for example, nano-imprinting, the formation of the structure 38 is not easy, and production costs increase.

First Exemplary Embodiment

Figure 1A:
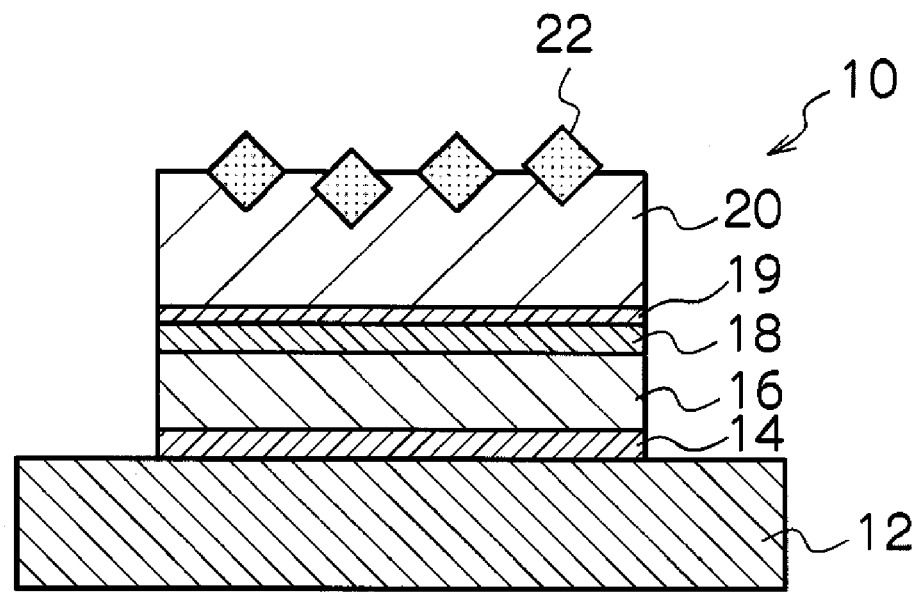
FIG. 1A is a schematic diagram showing the configuration of an organic EL light emitting device according to the first exemplary embodiment of the present invention.

FIG. 1A schematically shows an example of the configuration of a light emitting device according to the invention (first exemplary embodiment). This light emitting device 10 is of top emission type in which the light generated at the light emitting layer is extracted from the second electrode side, and has a supporting substrate 12, a first electrode 14 disposed on the supporting substrate 12, an electroluminescent layer which is disposed on the first electrode 14 and includes at least a light emitting layer 16, a second electrode 18 which is disposed opposite to the first electrode 14, with the electroluminescent layer being interposed therebetween, a sealing layer 19 disposed on the second electrode 18, and a resin layer 20 disposed on the sealing layer. At the surface of the resin layer 20, that is, at the surface from the side where the light generated in the light emitting layer 16 is extracted, there are a large number of light transmitting particles 22 scattered in a state of being partially embedded. When the light transmitting particles 22 are scattered at the surface of the resin layer 20 in such a state, unevenness is formed at the surface layer of the resin layer 20, and unevenness resulting from the light transmitting particles 22 is also generated on the external side of the resin layer 20.

Figure 1B:
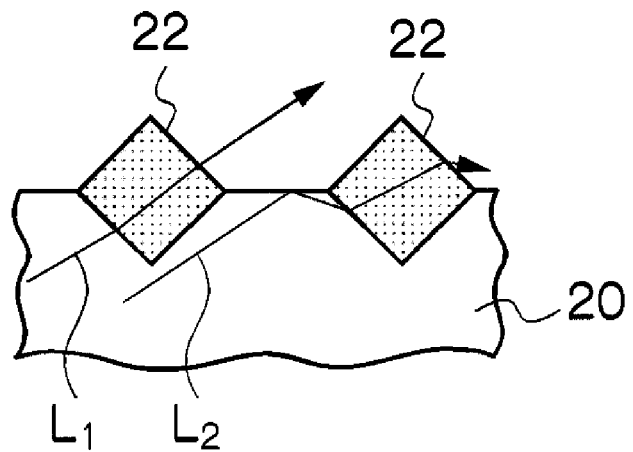
FIG. 1B is a schematic diagram modeling the light path of the organic EL light emitting device shown in FIG. 1A.

FIG. 1B shows a magnified view of the surface part of the resin layer 20. The light coming from the light emitting layer 16 enters the resin layer 20 via the second electrode 18 and the sealing layer 19, and a portion of light $L_1$ enters the part of a light transmitting particle 22 that is embedded in the resin layer 20. The light transmitting particle 22 functions like a prism, and the light $L_1$ which has entered the light transmitting particle 22 passes through the interior of the particle and comes out to the external side of the resin layer 20. Further, even if a light $L_2$ which arrives at the surface of the resin layer 20 without meeting the light transmitting particles 22, is reflected and returns into the resin layer 20, $L_2$ enters the part of a particle 22 that is embedded in the resin layer 20 and comes out to the external side at the exposed part of the particle. In this manner, when a large number of light transmitting particles 22 are scattered at the surface of the resin layer 20 such that the particles each have a part embedded and the remaining part exposed, light is easily captured by the unevenness at the surface part of the resin layer 20, the probability for light to enter the light transmitting particles 22 is increased, and light is efficiently extracted to the external side of the resin layer 20 via the light transmitting particles 22.

Hereinafter, the respective constituent members and the production method will be described using an example of an organic EL element.

<Supporting Substrate>

In regard to the supporting substrate 12, a supporting substrate which has a strength capable of supporting an organic electroluminescent element formed thereon, is used. Examples thereof include inorganic materials such as yttria-stabilized zirconia (YSZ) and glass; and organic materials, such as polyesters such as polyethylene terephthalate, polybutylene phthalate and polyethylene naphthalate, polystyrene, polycarbonates, polyether sulfone, polyallylate, polyimides, polycycloolefins, norbornene resins, and poly(chlorotrifluoroethylene).

In the case of using glass as the supporting substrate 12, it is preferable to use non-alkali glass in order to reduce ions eluting from the glass. In the case of using soda lime glass, it is preferable to use a glass product provided with a barrier coating such as made of silica.

In the case of using a supporting substrate 12 formed from an organic material, a material which is excellent in heat resistance, dimensional stability, solvent resistance, electrical insulating properties and processability, is preferred. Particularly, in the case of using a supporting substrate 12 made of plastics, it is preferable to provide a moisture permeation preventing layer or a gas barrier layer on one surface or both surfaces of the supporting substrate 12, in order to suppress permeation of moisture and oxygen. As the material for the moisture permeation preventing layer or gas barrier layer, an inorganic substance such as silicon nitride, silicon oxide, silicon oxynitride and aluminum oxide, and a laminate of the inorganic substance and an organic substance such as acrylic resin, may be suitably used. The moisture permeation preventing layer or the gas barrier layer may be formed by, for example, a high frequency sputtering method or the like.

In the case of using a thermoplastic supporting substrate, a hard coat layer, an undercoat layer or the like may also be provided as necessary.

The shape, structure, size and the like of the supporting substrate 12 are not particularly limited, and may be appropriately selected in accordance with the use, purpose and the like of the organic EL element. In general, the shape of the supporting substrate 12 is preferably a plate shape, from the viewpoints of handling, easiness of formation of organic EL elements, and the like. The structure of the supporting substrate 12 may be a single layer structure, or may also be a laminated structure. Furthermore, the supporting substrate 12 may be constituted of a single member, or may also be constituted of two or more members.

The light emitting device 10 according to the embodiment is of top emission type, and since it is not necessary to extract light emission from the side of the supporting substrate 12, a metal substrate made of, for example, stainless steel, iron (Fe), aluminum (Al), nickel (Ni), cobalt (Co), copper (Cu), or an alloy thereof, or a silicon substrate may be used. If a supporting substrate made of metal is to be used, the substrate has high strength, and has high gas barrier properties against the moisture or oxygen in the atmosphere, even if its thickness is small. In the case of using a supporting substrate made of metal, an insulating film for securing electrical insulating properties is provided between the supporting substrate 12 and a lower electrode 14.

<Electrode>

The first electrode (lower electrode) 14 and the second electrode (upper electrode) 18 are made such that one serves as an anode and the other serves as a cathode. The two electrodes 14 and 18 are disposed opposite to each other, with an organic EL layer including at least a light emitting layer 16 interposed therebetween. When an electric field is applied between the two electrodes 14 and 18, the light emitting layer 16 interposed between the electrodes 14 and 18 can emit light. Since the light from the light emitting layer 16 is extracted from the side of the second electrode 18, it is preferable that the second electrode 18 has high transmissivity of light with respect to the light from the light emitting layer 16.

-Anode-

Anode is not particularly limited in the shape, structure, size and the like, as long as it functions as an electrode for supplying holes to the organic EL layer, and may be appropriately selected from known electrode materials in accordance with the use, purpose and the like of the organic EL element.

As for the material constituting the anode, for example, metals, alloys, metal oxides, electroconductive compounds, and mixtures of these may be suitably mentioned. Specific examples thereof include electroconductive metal oxides such as tin oxide doped with antimony, fluorine or the like (ATO, FTO), tin oxide, zinc oxide, indium oxide, indium tin oxide (ITO), and indium zinc oxide (IZO); metal such as gold, silver, chromium and nickel; as well as mixtures or laminates of these metals and electroconductive metal oxides; inorganic electroconductive materials such as copper iodide and copper sulfide; organic electroconductive materials such as polyaniline, polythiophene, and polypyrrole; as well as laminates of these and ITO; and the like.

In the light emitting device 10 of the embodiment, since the light emitted from the EL layer is extracted from the side of the second electrode 18, in the case of making the first electrode 14 as an anode, it is preferable to have the first electrode constituted of a material having high reflectance. Among the above-mentioned materials, metals are preferred, and in particular, Al is preferred from the viewpoints of productivity, high electroconductivity, reflectance, costs and the like.

Examples of the method of forming an anode include wet methods such as printing methods and coating methods; physical methods such as vacuum deposition methods, sputtering methods and ion plating methods may be used; and chemical methods such as CVD methods and plasma CVD methods, and the method may be appropriately selected, with consideration of the suitability to the material constituting the anode. For example, in the case of using ITO as the material for anode, the anode may be formed according to a direct current or high frequency sputtering method, a vacuum deposition method, an ion plating method or the like.

The position for forming the anode may be appropriately selected in accordance with the use, purpose and the like of the organic EL element, and in the case of forming the first electrode 14 as an anode, the anode may be formed on the supporting substrate 12, or in the case of forming the second electrode 18 as an anode, the anode may be formed on the organic EL layer. The anode may be formed over the entire surface, or may also be formed in parts.

Upon formation of an anode, patterning may be carried out by chemical etching based on photolithography or the like, or may also be carried out by physical etching based on laser irradiation. Furthermore, performing vacuum deposition, sputtering or the like through a mask is also acceptable, and a lift-off method or a printing method may also be carried out.

The thickness of the anode may be appropriately selected in accordance with the material constituting the anode or the like, but the thickness is usually about 10 nm to 50 μm, and preferably 50 nm to 20 μm.

The resistance value of the anode is preferably $10^3 \Omega/\square$ or less, and more preferably $10^2 \Omega/\square$ or less, in view of securely supplying holes to the organic EL layer.

The light transmittance of the second electrode 18 is preferably 60% or more, and more preferably 70% or more. Transparent anodes are described in detail in "New Development of Transparent Electrode Films," supervised by Yutaka Sawada, published by CMC Publishing Co., Ltd. (1999). Matters described in this publication can also be applied to the present invention. For example, in the case of using a supporting substrate made of plastics having low heat resistance, a transparent anode formed thereon using ITO or IZO at a low temperature of 150° C. or lower is preferred.

-Cathode-

A cathode usually has a function as an electrode for injecting electron into the organic EL layer, and is not particularly limited in the shape, structure, size and the like, and the cathode may be appropriately selected from known electrode materials in accordance with the use, purpose and the like of the organic EL element. As the material constituting the cathode, for example, metals, alloys, metal oxides, electroconductive compounds, mixtures of these, and the like may be mentioned. Specific examples thereof include alkali metals (for example, Li, Na, K, Cs and the like), alkaline earth metals (for example, Mg, Ca and the like), gold, silver, lead, aluminum, a sodium-potassium alloy, a lithium-aluminum alloy, a magnesium-silver alloy, rare earth metals such as indium and ytterbium, and the like. These may be used individually alone, but from the viewpoint of compatibility between stability and electron injection, two or more materials may be suitably used in combination.

Among these, as the material constituting the cathode, alkali metals or alkaline earth metals are preferred from the viewpoint of electron injection, and from the viewpoint of having excellent storage stability, a material containing aluminum as a primary component is preferred. The material containing aluminum as a primary component means aluminum alone, an alloy of aluminum and 0.1% to 10% by mass of an alkali metal or alkaline earth metal, or a mixture thereof (for example, lithium-aluminum alloy, magnesium-aluminum alloy, or the like). The materials for cathode are described in detail in, for example, JP-A No. 2-15595 and JP-A No. 5-121172, and the materials described in these publications may also be applied to the present invention.

The method for forming a cathode is not particularly limited, and the cathode may be formed according to a known method. The cathode may be formed according to a method appropriately selected from, for example, among wet methods such as printing methods and coating methods; physical methods such as vacuum deposition methods, sputtering methods and ion plating methods; and chemical methods such as CVD methods and plasma CVD methods, with consideration of the suitability to the material constituting the cathode. For example, in the case of selecting a metal or the like as the material for cathode, the cathode may be formed according to a sputtering method or the like, using one or two or more materials simultaneously or sequentially.

The thickness of the cathode may be appropriately selected in accordance with the material constituting the cathode or the direction of light extraction, and the thickness is usually about 1 nm to 5 µm.

Upon the formation of a cathode, patterning may be carried out by chemical etching based on photolithography, or may also be carried out by physical etching based on laser irradiation. Furthermore, performing vacuum deposition, sputtering or the like through a mask is also acceptable, and a lift-off method or a printing method may also be carried out.

The position for forming the cathode is not particularly limited, and in the case of using the first electrode 14 as the cathode, the cathode may be formed on the supporting substrate 12, or in the case of using the second electrode 18, the cathode may be formed on the organic EL layer. The cathode may be formed over the entire surface, or may also be formed in parts.

A dielectric layer composed of the fluoride, oxide or the like of an alkali metal or an alkaline earth metal, may be formed between the cathode and the organic EL layer, at a thickness of 0.1 to 5 nm. This dielectric layer may also be understood as one type of electron injection layer. The dielectric layer may be formed by, for example, a vacuum deposition method, a sputtering method, an ion plating method, or the like.

<Organic EL Layer>

The organic EL layer has a configuration including at least a light emitting layer 16, which is disposed between the upper and lower electrodes 18 and 14. One of the upper and lower electrodes 18 and 14 serves as an anode, and the other serves as a cathode, but since the light emitting device 10 according to the invention involves extraction of the light emitted from the light emitting layer 16 through the side of the upper electrode 18, at least the upper electrode 18 is formed by selecting an electrode material and a thickness so as to have light transmissivity.

The organic EL element may employ, for example, layer constitutions such as follows, but is not limited to the following layer constitutions, and may be appropriately determined in accordance with the purpose or the like.

Anode/light emitting layer/cathode

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/blocking layer/electron transport layer/cathode Anode/hole injection layer/hole transport layer/light emitting layer/blocking layer/electron transport layer/electron injection layer/cathode Anode/hole transport layer/blocking layer/light emitting layer/electron transport layer/cathode Anode/hole transport layer/blocking layer/light emitting layer/electron transport layer/electron injection layer/cathode Anode/hole injection layer/hole transport layer/blocking layer/light emitting layer/electron transport layer/cathode Anode/hole injection layer/hole transport layer/blocking layer/light emitting layer/electron transport layer/electron injection layer/cathode The region where the first electrode 14, the organic EL layer and the second electrode 18 are superimposed on each other emits light. Therefore, when the respective light emitting layers corresponding to the respective colors are patterned such that, for example, pixels of R, G and B are arranged in a matrix in a plane on the supporting substrate 12, full color display may be achieved.

As the layers other than the light emitting layer, which constitute the organic EL layer, various layers such as a hole transport layer, an electron transport layer, a charge blocking layer, a hole injection layer, and an electron injection layer as described above may be mentioned. As a preferred layer constitution, for example, an embodiment in which a hole transport layer, a light emitting layer and an electron transport layer are laminated in this order from the anode side, may be mentioned, and also, for example, a charge blocking layer or the like may be present between the hole transport layer and the light emitting layer, or between the light emitting layer and the electron transport layer. There may be present a hole injection layer between the anode and the hole transport layer, and a electron injection layer may also be present between the cathode and the electron transport layer. Furthermore, the respective layers may be divided into plural secondary layers. Such various layers constituting the organic EL layer may be formed by any of a dry film forming method such as a deposition method or a sputtering method, as well as a transfer method, a printing method, and the like.

The material, thickness and the like of the various layers constituting the organic EL layer, including the light emitting layer, are not particularly limited, and may be selected from known materials, thicknesses and the like.

For example, the light emitting layer may be constituted only of a luminescent material, or may also be constituted of a layer containing a mixture of a host material and a luminescent material. The luminescent material may be a fluorescent luminescent material or a phosphorescent luminescent material, and the dopant may be one material, or may be two or more materials.

The thickness of the light emitting layer in general is preferably 1 nm to 500 nm, more preferably 5 nm to 200 nm, and even more preferably 10 nm to 100 nm.

<Sealing Layer>

The sealing layer 19 is provided on the second electrode 18. The sealing layer 19 is provided mainly to suppress the invasion of gases such as moisture and oxygen into the electrodes 18 and 14 and the organic layers such as the light emitting layer 16, and the sealing layer is usually formed using inorganic substances such as silicon nitride, silicon oxide, silicon oxynitride and aluminum oxide, according to a known method. For example, the sealing layer 19 may be formed according to a method appropriately selected from among wet methods such as printing methods and coating methods; physical methods such as vacuum deposition methods, sputtering methods and ion plating methods; chemical methods such as CVD methods and plasma CVD methods; and the like, with consideration of the suitability to the material. In the light emitting device 10 according to the invention, since the light emitted from the light emitting layer (organic EL layer) passes through the sealing layer 19, it is preferable to constitute the sealing layer 19 with a material having high transmittance, as in the case of the second electrode 18.

The thickness of the sealing layer 19 also depends on the material or the like, but usually the thickness is preferably 10 nm to 10 µm, and particularly preferably 100 nm to 5 µm.

<Resin Layer>

The resin layer 20 is provided on the sealing layer 19, and at the surface at the side of light extraction, light transmitting particles 22 are scattered in a state of being partially exposed.

The resin layer 20 is formed from a resin having transmissivity to the light coming from the light emitting layer 16. For example, the resin layer 20 may be formed using a UV-curable resin such as an epoxy resin or an acrylic resin, a thermosetting resin, a thermoplastic resin, or the like.

If the thickness of the resin layer 20 is too small, the proportion (volume ratio) of each particle 22 being embedded is restricted; on the other hand, if the thickness is too large, light transmissivity may decrease. From these viewpoints, the thickness of the resin layer 20 is preferably 0.1 to 100 µm, more preferably 1 to 50 µm, and particularly preferably 2 to 20 µm.

The method for forming the resin layer 20 is not particularly limited as long as the resin layer 20 can be formed to have a predetermined thickness on the sealing layer 19, and a known method may be applied. For example, the resin layer 20 is formed according to a method that is appropriately selected from among wet methods such as printing methods and coating methods; physical methods such as vacuum deposition methods, sputtering methods and ion plating methods; and chemical methods such as CVD methods and plasma CVD methods, with consideration of the suitability to the material.

On the other hand, it is desirable for the light transmitting particles 22 to have light transmissivity, irrespective of whether the material is inorganic or organic. As the material constituting the light transmitting particles 22, tin oxide, zinc oxide, aluminum oxide, titanium oxide, barium titanate, ITO and the like may be mentioned.

Additionally, it is preferable that the refractive index of the light transmitting particles 22 be higher than the refractive index of the resin layer 20, so that when the light from the light emitting layer 16 enters a light transmitting particle 22 through the resin layer 20, the light is refracted, and easily exits at the exposed part of the light transmitting particle 22.

The refractive index of the resin layer 20 is preferably in the range of 1.4 to 1.8, and the refractive index of the light transmitting particles 22 is preferably in the range of 1.8 to 3.0.

The shape of the light transmitting particles 22 is not particularly limited, and may be a regular shape such as a rectangular solid shape, a spherical shape or an ellipsoidal shape, or an irregular shape having unevenness at the surface. However, the shape is preferably a spherical shape (the cross-section is circular in shape), so that light that has entered may be easily extracted.

The size of the light transmitting particles 22 is such that the maximum diameter is preferably 0.1 to 10 µm, and more preferably 0.5 to 3 µm, from the viewpoint of suppressing the influence on the second electrode 18, the light emitting layer 16 or the like upon implanting the light transmitting particles 22 into the resin layer 20, and of securely enhancing the light extraction efficiency.

In order to securely enhance the light extraction efficiency, the occupancy of the light transmitting particles 22 in the light emitting region (pixels) is preferably 20% to 80%, and more preferably 40% to 60%, and it is preferable that the light transmitting particles be distributed uniformly as far as possible.

Furthermore, in view of enhancing the light extraction efficiency and preventing separation of the particles from the resin layer 20, it is preferable that as many as possible of the light transmitting particles 22 scattered at the surface of the resin layer 20 each have a part embedded into the resin layer 20 and the remaining part thereof exposed at the surface. However, it is not necessary that all of the light transmitting particles 22 be embedded in this manner, and there is no problem even if, for example, there are some particles entirely embedded inside the resin layer 20.

Specifically, of the light transmitting particles 22 scattered in the resin layer 20, if 30% or more of the particles are partially embedded in the resin layer 20 at a volume proportion of ¼ to ¾ of each partially embedded particle, the light extraction efficiency may be securely enhanced. Here, the volume ratio of the part of the light transmitting particles 22 embedded in the resin layer 20 may be measured by observing the cross-section of the resin layer by SEM.

The resin layer 20 may also serve as a solid sealing layer. That is, in order to prevent an organic EL element from deteriorating due to the oxygen or moisture in the atmosphere, it would be necessary to seal the element; however, if a resin layer 20 is formed from a material having high gas barrier properties, the resin layer may also serve as a sealing layer. Also, if the light transmitting particles 22 are scattered to be present at a high density such that, for example, the occupancy would be 50% or greater, the gas barrier properties may be further enhanced.

As for the method for embedding the light transmitting particles 22 into the resin layer 20, gas flow conveyance is suitable.

For example, after the sealing layer 19 is formed, a resin composition coating liquid for forming the resin layer 20 is applied on the sealing layer 19 to form a film. The composition coating liquid for the resin layer is prepared in the form of varnish having the resin component dissolved in a solvent, and the coating liquid is uniformly applied on the sealing layer 19 according to any of the coating methods such as knife coating, roll coating, curtain coating, spin coating, bar coating, and dip coating, and drying the coating liquid. The resin content in the coating liquid is preferably in the range of 10% to 50% by mass, and more preferably in the range of 20% to 40% by mass.

After the resin composition coating liquid is applied on the sealing layer 19, the coating liquid is dried to remove the solvent in the coating film. Although dependent also on the resin material and the type of solvent, the temperature at the time of drying is preferably 20° C. to 200° C., and more preferably 80° C. to 180° C., with the influence on the organic EL element or the productivity taken into consideration. The drying time is preferably 1 second to 50 hours, and more preferably 10 seconds to 10 hours.

After drying, the resin layer 20 attains a semi-cured state by supplying energy thereto as necessary. The semi-cured state means an intermediate state prior to the state of the resin layer 20 being completely cured, and according to the invention, the semi-cured state is a state in which the resin layer 20 has a hardness of 40% to 60% of the hardness obtainable upon complete curing. It is preferable to add energy so that the resin forms a crosslinked structure to some degree. The resin layer 20 may be cured to a desired hardness by adjusting the irradiation dose or length of time of the UV irradiation if the resin is an ultraviolet radiation-curable resin, or by adjusting the heating temperature or length of heating time if the resin is a thermosetting resin.

If using a thermoplastic resin, the resin layer 20 may be cured by removing the solvent, and then lowering the temperature to ambient temperature, and then after the resin is completely cured, the resin may be heated to attain a semi-cured state.

Figure 3:
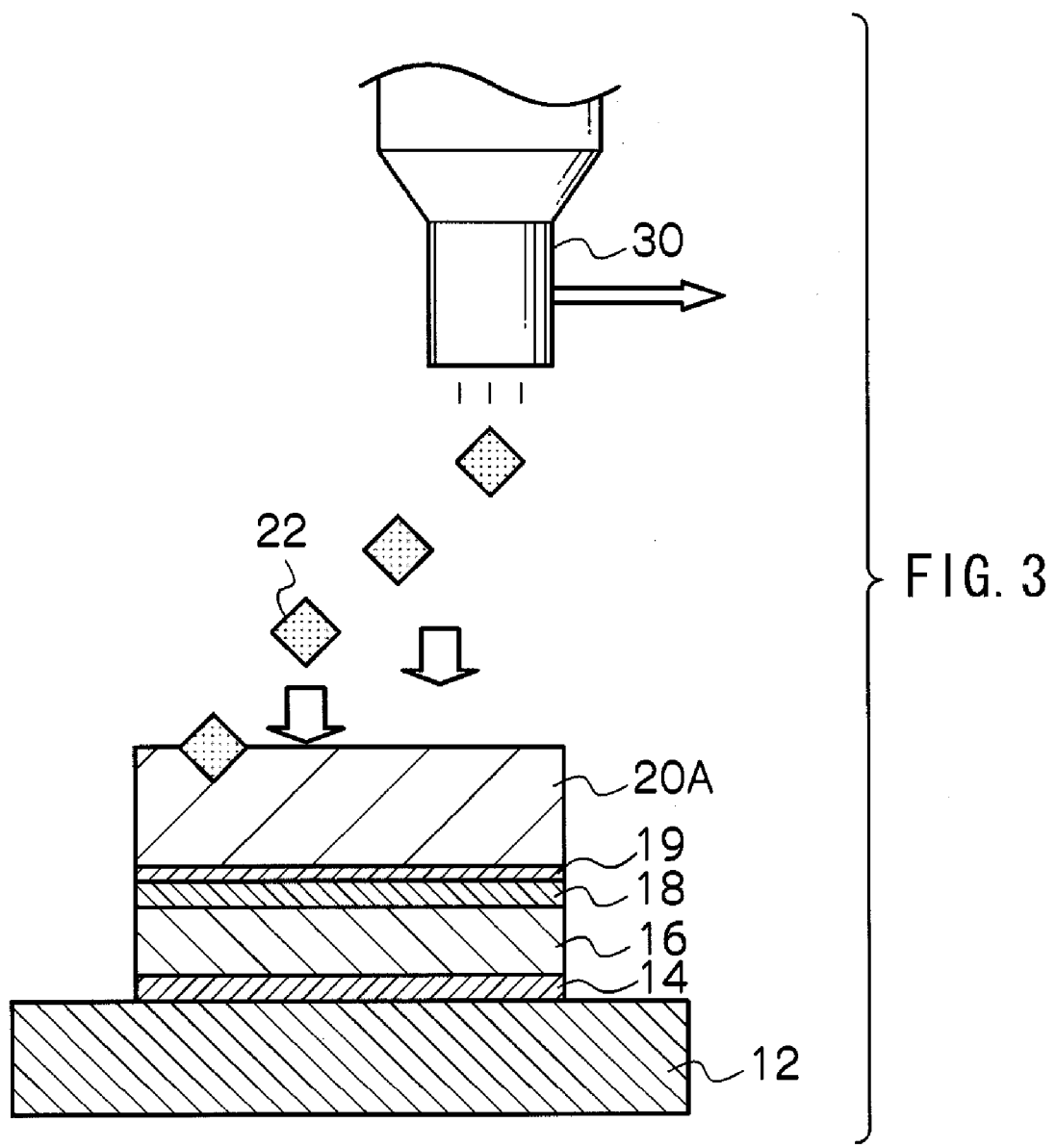
FIG. 3 is a schematic diagram showing an example method for implanting light transmitting particles into a resin layer.

Against the resin layer 20 made in a semi-cured state, the light transmitting particles 22 are ejected, for example, by gas flow conveyance from a nozzle 30 as shown in FIG. 3, thereby implanting particles into the resin layer in a semi-cured state 20A. It is preferable to use an inert gas such as argon or nitrogen as the gas for gas flow conveyance, in order to prevent deterioration of the organic EL element. Since the resin layer 20A is in a semi-cured state, each of the light transmitting particles 22 which have been ejected together with a gas stream from the nozzle 30, has a part embedded at the surface part of the resin layer 20A and the remaining part exposed.

The degree (depth) of embedding the light transmitting particles 22 into the resin layer 20A may be adjusted by the hardness of the semi-cured resin layer 20A, or by the flow rate of the particles 22 fed from the nozzle 30. For example, as the resin layer 20A is harder, it is more difficult for the particles 22 to be embedded in the resin layer 20A, and as the flow rate of the particles 22 is faster, it is easier for the particles to be embedded in the resin layer 20A. The flow rate of the particles 22 may be set in accordance with the size of the particles 22 or the hardness of the resin layer 20A, but from the viewpoint of embedding the particles 22 in the resin layer 20A in a semi-cured state such that a part of each particle is exposed, and at the same time, suppressing the influence on the organic EL element, it is preferable that the particles 22 be implanted at a flow rate of about 10 m/s to 30 m/s.

Such a gas flow conveyance of the light transmitting particles 22 may be carried out by, for example, using a sand blasting machine manufactured by Fuji Manufacturing Co., Ltd.

At the time of implanting the particles 22 into the resin layer 20A, a mask may also be used according to necessity. For example, in the case where the light emitting layer 16 has been patterned as the pixels for R, G and B, the type of the light transmitting particles (light transmittance, refractive index, or the like) or the amount of supply may be adjusted in accordance with the emission color, using a mask having apertures corresponding to the respective pixels.

After the light transmitting particles 22 have been implanted into the resin layer 20A in a semi-cured state, the resin layer 20A is further cured. Curing of the resin layer 20A is accelerated by irradiating UV if the resin is an ultraviolet radiation-curable resin, or by heating if the resin is a thermosetting resin. If the resin layer 20A is formed from a thermoplastic resin, the resin layer may be cured by cooling to ambient temperature. When the curing of the resin layer 20A is accelerated, the particles 22 stuck at the surface of the resin layer 20A become securely fixed.

After the light transmitting particles 22 have been implanted into the resin layer 20A in a semi-cured state, and the resin layer 20A has been further cured, it is preferable to remove any particles that are not embedded in the sufficiently cured resin layer 20 and are remaining on the surface. Examples of the method for removing such residual particles include a method of blowing an inert gas such as nitrogen against the surface of the resin layer 20, a method of shaking the entire assembly including the substrate 12, and the like.

<Sealing Substrate>

Subsequently, in order to prevent the organic EL element from deteriorating under the action of moisture or oxygen in the atmosphere, and to prevent any foreign materials from hitting the organic EL element and causing damages, and the like, the organic EL element is sealed using a sealing substrate 26.

For the sealing substrate 26, a product having light transmissivity as well as high barrier properties against oxygen or moisture is used. Preferably, a glass substrate or a resin film provided with a barrier layer may be used. The thickness of the sealing substrate 26 is preferably 0.05 to 2 mm, from the viewpoints of light transmissivity, strength, weight reduction and the like.

As for the sealing substrate 26 made of a resin film, a material similar to that of the supporting substrate 12, such as PET, PEN or PES, may be used. The thickness of the barrier layer may be determined in accordance with the material or the required barrier properties, but the thickness is usually 100 nm to 5 μm, and preferably 1 μm to 5 μm.

The sealing substrate 26 is fixed onto the supporting substrate 12 with an adhesive 24 interposed therebetween. A photocurable adhesive or a thermosetting adhesive such as an epoxy resin may be used, and for example, a thermosetting adhesive sheet may also be used.

Figure 2:
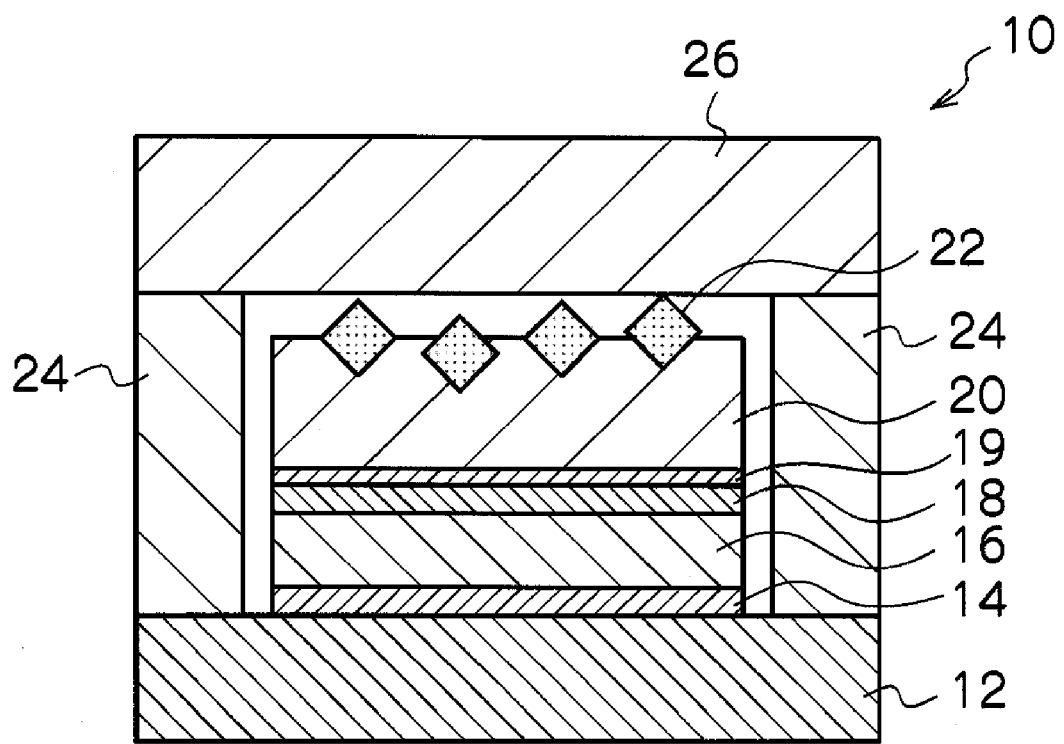
FIG. 2 is a schematic diagram showing an example configuration of the organic EL light emitting device which is provided with a sealing substrate in the first exemplary embodiment.

The sealing substrate 26 is provided to cover at least the organic EL element, but as shown in FIG. 2, if the sealing substrate 26 is in contact with the light transmitting particles 22, separation of the particles 22 from the resin layer 20 can be more securely prevented.

At the time of sealing, the space between the sealing substrate 26 and the supporting substrate 12 is filled with an inert fluid in the form of gas or liquid. Examples of inert gas include argon, nitrogen, and the like. Examples of inert liquid include paraffins, liquid paraffins, fluorine-containing solvents such as perfluoroalkanes, perfluoroamines or perfluoroethers, chlorine-containing solvents, silicone oils, and the like.

When external lines (not shown) are connected respectively to the upper and lower electrodes 18 and 14, and direct current (may also include alternating current component, if necessary) voltage (usually, 2 volts to 15 volts), or direct current electricity is applied, the organic EL layer in the region interposed between the two electrodes may be made to emit light. As for the implanting method, the implanting methods described in JP-A Nos. 2-148687, 6-301355, 5-29080, 7-134558, 8-234685, 8-241047, Japanese Patent No. 2784615, U.S. Pat. Nos. 5,828,429, 6,023,308, and the like may be applied.

Through the processes as described above, a top emission light emitting device 10 according to the present exemplary embodiment is produced.

In the light emitting device 10 having such a configuration, since there is present the unevenness resulting from the light transmitting particles 22 at the surface part of the resin layer 20, the light generated at the light emitting layer 16 easily enters the part of a particle 22 that is embedded in the resin layer 20, and easily exits to the external side through the part exposed from the resin layer 20. Therefore, the light generated at the light emitting layer 16 may be extracted highly efficiently.

Furthermore, the light transmitting particles 22 may be easily and uniformly provided, by implanting the particles into the resin layer 20A in a semi-cured state by gas flow conveyance, and then completely curing the resin layer 20. Therefore, the production is easy, and the production costs may be reduced lower.

Second Exemplary Embodiment

Figure 6A:
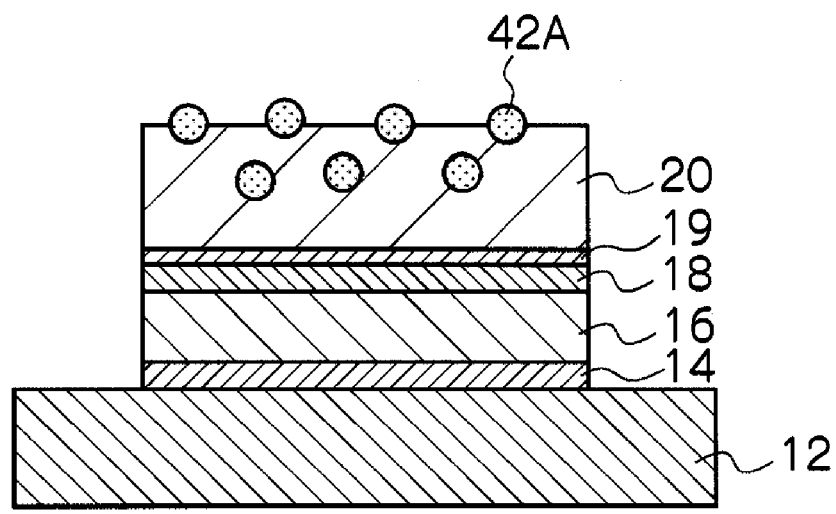
FIG. 6A is a schematic diagram showing the configuration of an organic EL light emitting device according to the second exemplary embodiment of the invention.

FIG. 6A schematically shows another example of the configuration of the light emitting device according to the invention (the second exemplary embodiment).

Figure 6B:
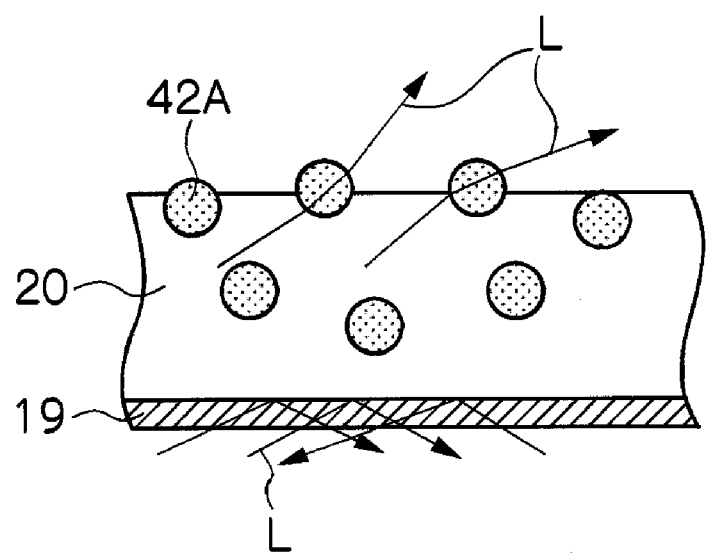
FIG. 6B is a schematic diagram modeling the light path of the organic EL light emitting device shown in FIG. 6A.

If a sealing layer 19 formed from an inorganic material has been provided, light coming from the light emitting layer 16 easily enters the layer since the refractive index of the sealing layer 19 is high. However, if the refractive index of the resin layer 20 is smaller than the refractive index of the sealing layer 19, the light coming from the light emitting layer 16 is prone to be reflected at the interface between the resin layer 20 and the sealing layer 19. However, even in this case, since a portion of the light coming from the light emitting layer 16 enters the resin layer 20, if there are present light transmitting particles 42A each having a part embedded at the surface of the resin layer 20, light is efficiently extracted to the outside via the light transmitting particles 42A, as shown in FIG. 6B, and external quantum efficiency may be improved.

Third Exemplary Embodiment

Figure 7A:
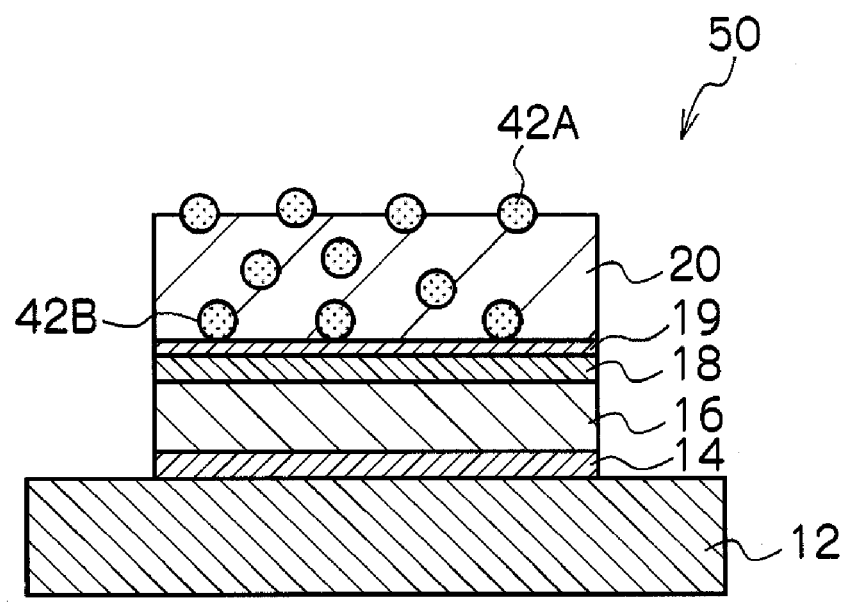
FIG. 7A is a schematic diagram showing the configuration of an organic EL light emitting device according to the third exemplary embodiment of the invention.

FIG. 7A schematically shows another example of the configuration of the light emitting device according to the invention (the third exemplary embodiment).

In this light emitting device 50, among the light transmitting particles scattered in a resin layer 20, one portion of the particles 42A are scattered such that a part of each particle is embedded in the surface of the side of light extraction from the light emitting layer 16, and another portion of the particles 42B among the light transmitting particles are scattered such that they contact a sealing layer 19, which is adjacent to the resin layer 20 at the opposite side of the side of light extraction (the side of the second electrode).

Figure 7B:
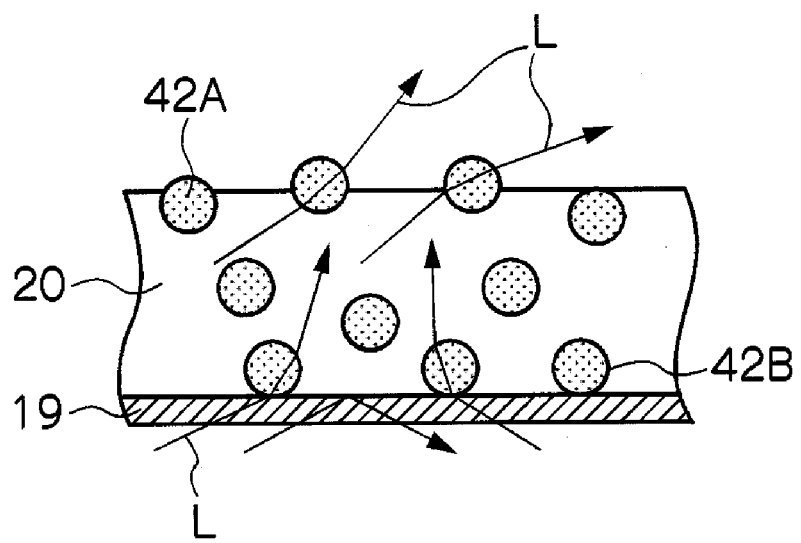
FIG. 7B is a schematic diagram modeling the light path of the organic EL light emitting device shown in FIG. 7A.

In the case where the refractive index of the resin layer 20 is smaller than the refractive index of the sealing layer 19 as described above, the light coming from the light emitting layer 16 is prone to be totally reflected at the interface between the resin layer 20 and the sealing layer 19. However, as shown in FIG. 7B, if the light transmitting particles 42B are in contact with the sealing layer 19, which is adjacent to the resin layer 20 at the opposite side of the side of light extraction (side of the second electrode), it becomes easy for light L which has passed through the sealing layer 19, to enter a light transmitting particle 42B and to be taken into the resin layer 20. Here, in order to make it easy for the light L coming from the sealing layer 19 to enter the light transmitting particle 42B, it is required that the refractive index of the light transmitting particles 42B be larger than the refractive index of the sealing layer 19. The refractive index of the light transmitting particles 42B is preferably larger by 0 to 2, and particularly preferably larger by 0.1 to 1, than the refractive index of the sealing layer 19.

Furthermore, in order to make the light coming from the sealing layer 19 to effectively enter the resin layer 20, it is preferable that 30% or more of the light transmitting particles scattered in the resin layer 20 be in contact with the resin layer 20 and the sealing layer 19.

The method for dispersing light transmitting particles 42A and 42B respectively to the predetermined positions in the resin layer 20, is not particularly limited, but the following method is suitable.

After an organic EL element is formed on a supporting substrate 12, a resin material including light transmitting particles 42B is applied on the sealing layer 19, to provide a resin layer in an uncured state. For example, the light transmitting particles 42B are mixed in advance into the liquid-state resin material for forming a resin layer, and the mixture is applied uniformly on the sealing layer 19 according to any of the coating methods such as knife coating, roll coating, curtain coating, spin coating, bar coating and dip coating, to provide a resin layer in an uncured state.

Figure 8:
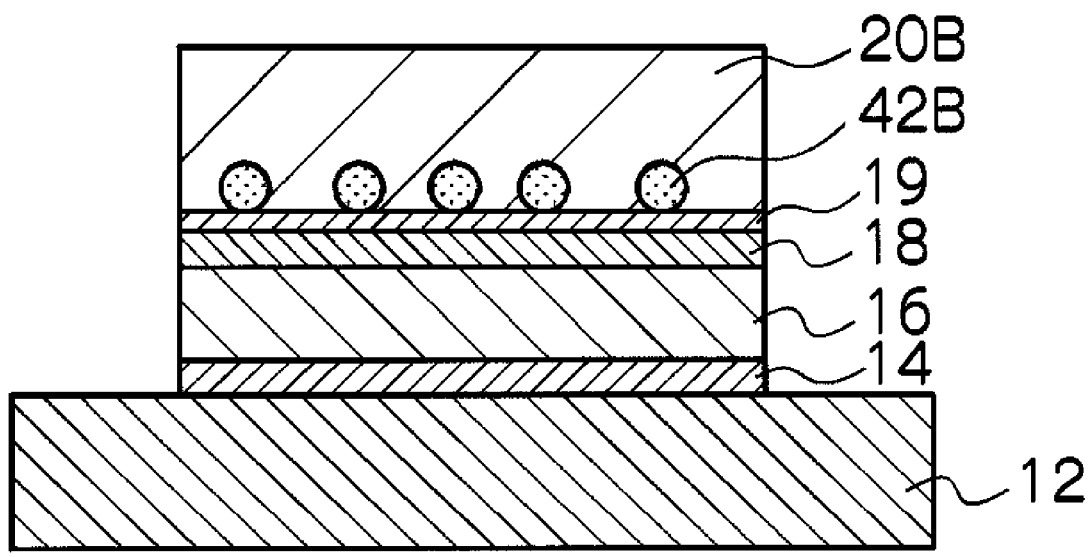
FIG. 8 is a schematic diagram showing the state in which light transmitting particles have been settled in a resin layer in an uncured state.

After the coating, as shown in FIG. 8, the light transmitting particles 42B are settled until at least a portion of the particles come into contact with the sealing layer 19 (that is, to the bottom of the uncured resin layer 20B). After at least a portion of the light transmitting particles 42B have settled, the uncured resin layer 20B is brought to a semi-cured state by a means such as heating, photo irradiation or leaving it standing (drying), in accordance with the resin material.

Figure 9:
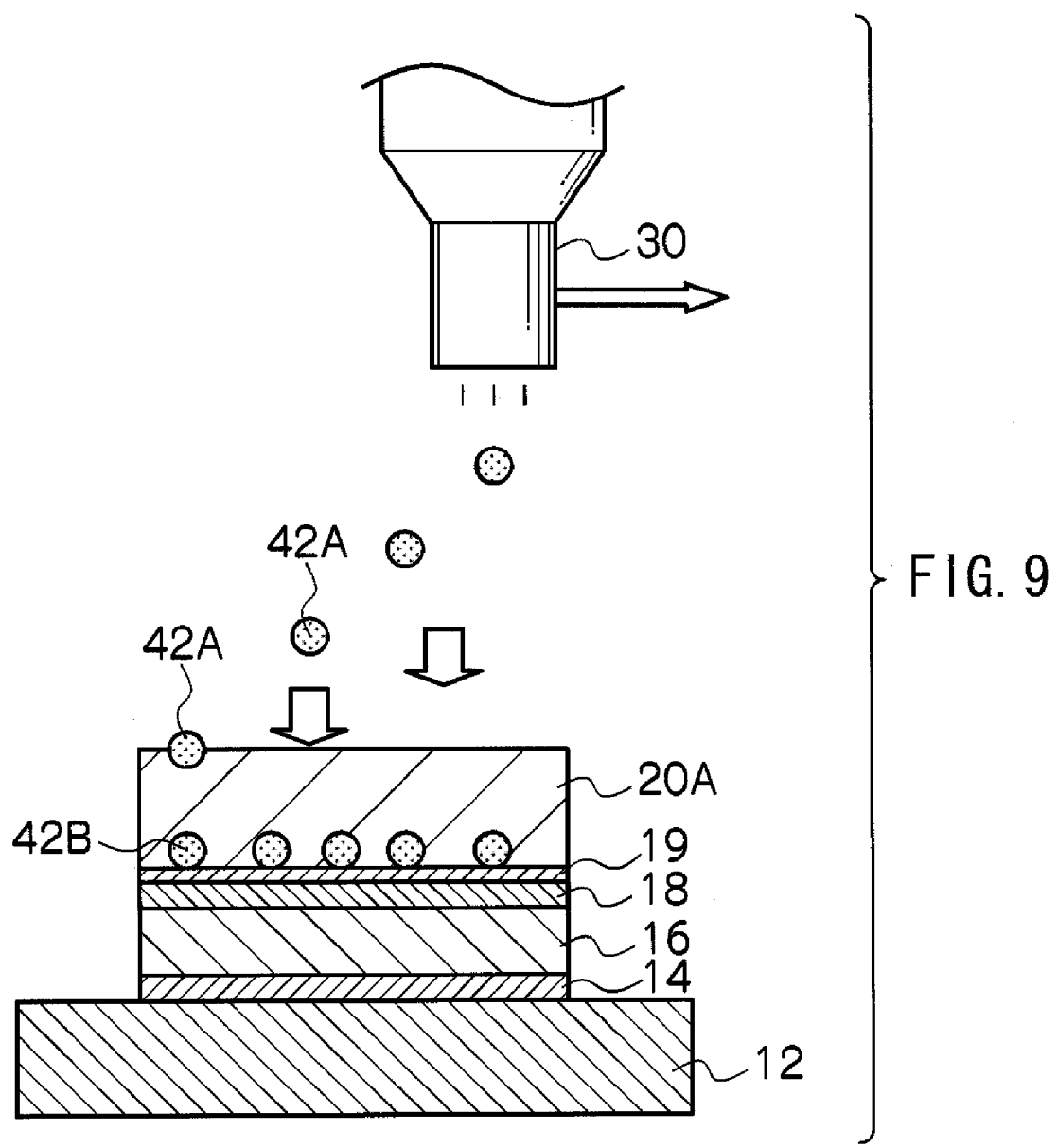
FIG. 9 is a schematic diagram showing an example method for implanting light transmitting particles into a resin layer in a semi-cured state, in which light transmitting particles have settled.

When the resin layer 20A in a semi-cured state is obtained, the light transmitting particles 42A are implanted into the resin layer 20A in a semi-cured state by gas flow conveyance such that a part of each light transmitting particle 42A is embedded in the resin layer 20, as shown in FIG. 9, in the same manner as in the first exemplary embodiment, and then the resin layer 20A in a semi-cured state is further cured.

Figure 10:
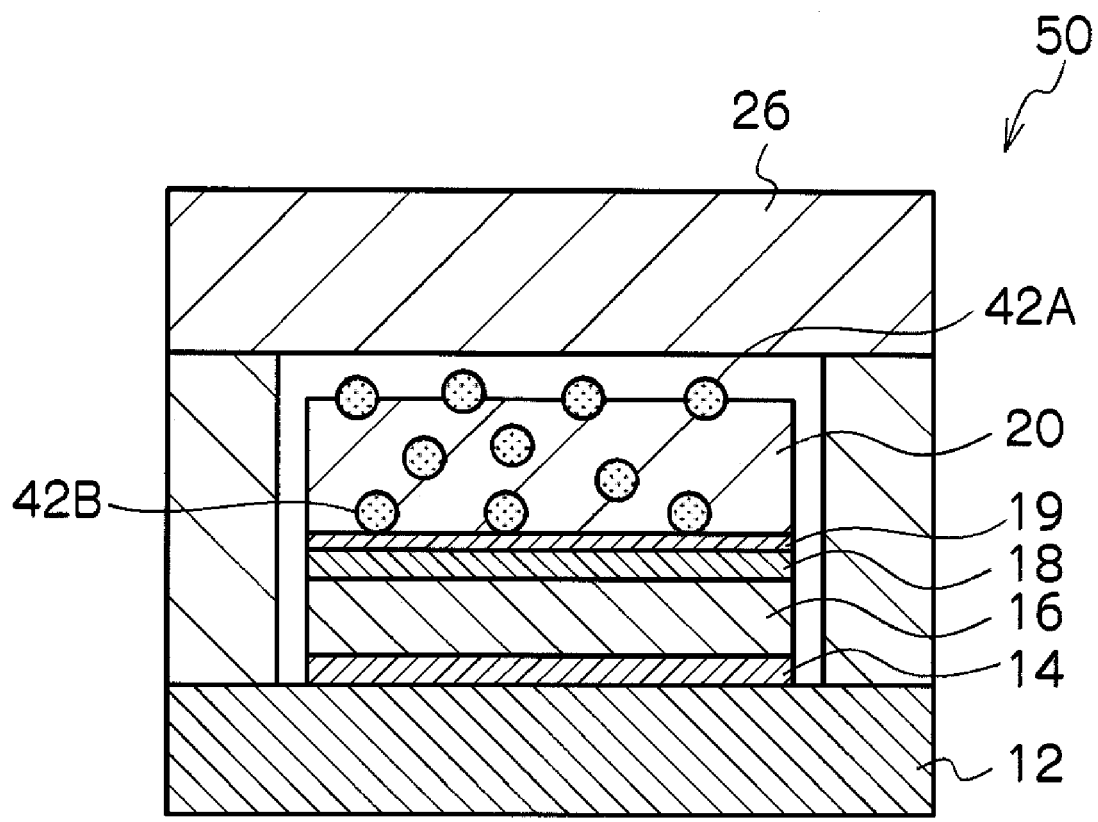
FIG. 10 is a schematic diagram showing an example configuration of the organic EL light emitting device which is provided with a sealing substrate in the third exemplary embodiment.

After the resin layer 20 has been sufficiently cured, the sealing substrate 26 is provided so as to cover at least the organic EL element. Thereby, a light emitting device 50 having a configuration as shown in FIG. 10 is produced.

In this manner, when light transmitting particles 42A and 42B are scattered in the resin layer 20, even in the case where the refractive index of the resin layer 20 is lower than the refractive index of the sealing layer 19, the light extraction efficiency may be more effectively enhanced.

In the case where the resin layer 20 is directly formed on the second electrode 18 without providing a sealing layer 19 thereon, and the refractive index of the resin layer 20 is lower than the refractive index of the second electrode 18, the light extraction efficiency may be further enhanced by making the light transmitting particles 42A to be scattered at the surface of the resin layer 20 while being partially embedded, and at the same time, making the light transmitting particles 42B to be scattered while contacting with the second electrode 18.

Fourth Exemplary Embodiment

The organic EL light emitting devices according to the first to third exemplary embodiments are top emission type devices, but they may also be of bottom emission type in which light is extracted from the side of supporting substrate.

Figure 12:
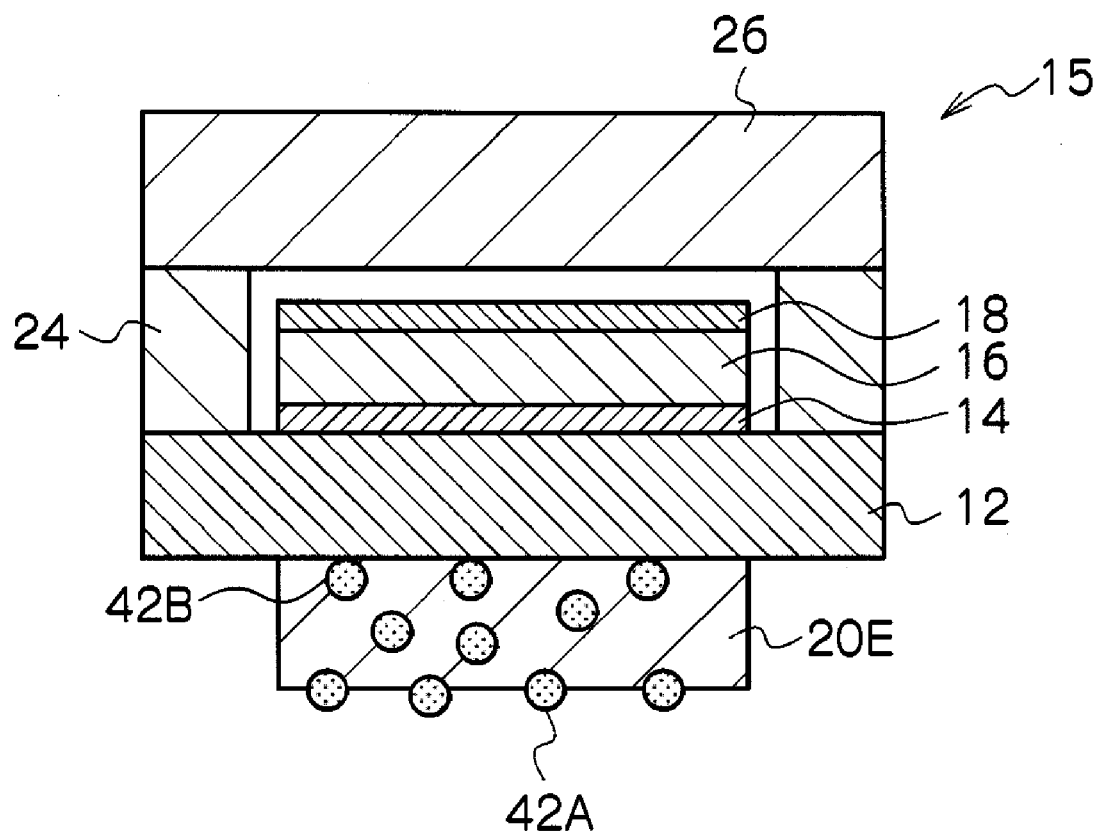
FIG. 12 is a schematic diagram showing a part of the configuration of a bottom emission organic EL light emitting device.

FIG. 12 schematically shows another example of the configuration of the light emitting device according to the invention (the fourth exemplary embodiment). In the light emitting device 13 according to the present exemplary embodiment, a resin layer 20E is disposed on the surface of a supporting substrate 12 at the opposite side of the surface where a first electrode 14 is disposed, and light transmitting particles 42A and 42B are scattered in the resin layer 20E. Furthermore, some particles 42A of the light transmitting particles are scattered such that a part of each particle is embedded at the surface of the resin layer 20E at the side of extraction from the light emitting layer. Here, since light is extracted from the side of the supporting substrate 12, the supporting substrate 12 and the first electrode 14 are constituted of materials having light transmissivity.

With this bottom emission light emitting device 15 of such a configuration, light may be efficiently extracted from the light emitting layer 16 via the resin layer 20E provided on the surface (light emitting surface) of the external side of the first supporting substrate 12, and the light transmitting particles 42A and 42B, under the action similar to that of the top emission organic EL light emitting devices according to the first and second exemplary embodiments.

Preferred embodiments of the light emitting device according to the invention are as follows.

30% or more of the light transmitting particles are partially embedded in the resin layer at a volume ratio of ¼ to ¾ of each partially embedded particle.

The refractive index of the light transmitting particles is higher than the refractive index of the resin layer.

The resin layer is disposed on the second electrode, and a sealing layer is disposed between the second electrode and the resin layer.

The resin layer is disposed on the second electrode directly or with an intermediate layer interposed therebetween, and the refractive index of the resin layer is higher than the refractive index of the layer which is adjacent to the resin layer at the side of the second electrode.

The resin layer is disposed on the second electrode directly or with the intermediate layer interposed therebetween, and the refractive index of the resin layer is lower than the refractive index of the layer which is adjacent to the resin layer at the side of the second electrode, and a portion of the light transmitting particles that are scattered in areas other than the surface of the resin layer on the side at which light is extracted from the light emitting layer, are in contact with the layer which is adjacent to the resin layer at the side of the second electrode.

30% or more of the light transmitting particles scattered in the resin layer are in contact with the layer which is adjacent to the resin layer at the side of the second electrode.

The resin layer also serves as a solid sealing layer.

A sealing substrate is further provided.

Preferred embodiments of the method for producing a light emitting device according to the invention are as follows.

Gas flow conveyance of the light transmitting particles is carried out using an inert gas.

The method further includes, before the implanting the light transmitting particles into the resin layer in a semi-cured state, providing an uncured resin layer by applying a resin material to which the light transmitting particles have been added, on the second electrode directly or with the intermediate layer interposed therebetween, or on the surface of the supporting substrate at the opposite side of the surface where the first electrode is disposed, and allowing at least a portion of the light transmitting particles to settle to the bottom of the uncured resin layer; and bringing the uncured resin layer to a semi-cured state after at least a portion of the light transmitting particles have settled.

According to the invention, a light emitting device which is easy to produce and is capable of effectively enhancing the light extraction efficiency, and a method for producing the same, are provided.

EXAMPLES

Example 1

1. Formation of Organic EL Element

On a supporting substrate (material: glass, 20 mm square), an Al anode was formed at a thickness of 100 nm, in a striped shape with a width of 2 mm.

After the anode was formed, partition walls were patterned by photolithography.

Subsequently, the substrate was mounted on a substrate holder in a vacuum deposition apparatus, with a mask (having 5 mm square openings) disposed thereon such that the areas where an organic layer 12 was to be formed were exposed, and then the interior of the apparatus was evacuated to a degree of vacuum of $5 \times 10^{-5}$ Pa.

On the anode, co-deposition was carried out using 2-TNATA (4,4',4"-tris(2-naphthylphenylamino)triphenylamine), and $MoO_3$ (molybdenum oxide) as a hole injection layer, such that the proportion of $MoO_3$ would be 30% by mass relative to the 2-TNATA, to thus form the hole injection layer at a thickness of 30 nm.

After the hole injection layer was formed, co-deposition was carried out using 2-TNATA and F4-TCNQ as a first hole transport layer, such that the proportion of F4-TCNQ would be 1.0% by mass relative to the 2-TNATA, to thus form the first hole transport layer at a thickness of 140 nm.

Subsequently, NPD (N,N'-dinaphthyl-N,N'-diphenyl-[1,1'-biphenyl]-4,4'-diamine) was formed as a second hole transport layer at a thickness of 10 nm.

After the second hole transport layer was formed, co-deposition was carried out using CBP (4,4'-dicarbazole-biphenyl) and $Ir(ppy)_3$ (tris(2-phenylpyridine)iridium(III)) such that the proportion of $Ir(ppy)_3$ would be 5% by mass relative to the CBP, to thus form a light emitting layer at a thickness of 30 nm.

Subsequently, BAlq (aluminum (III) bis(2-methyl-8-quinolinato)-4-phenylphenolate) was formed as an electron transport layer at a thickness of 40 nm.

On the electron transport layer, additionally, a LiF film was laminated at a thickness of 1 nm, and then a cathode formed from Al and Ag formed on Al was formed to thicknesses of 1.5 nm and 20 nm, respectively, in a striped shape with a width of 2 mm, to intersect with the anode. Thus, pixels of the organic EL element, each of which measured 2 mm square, were produced.

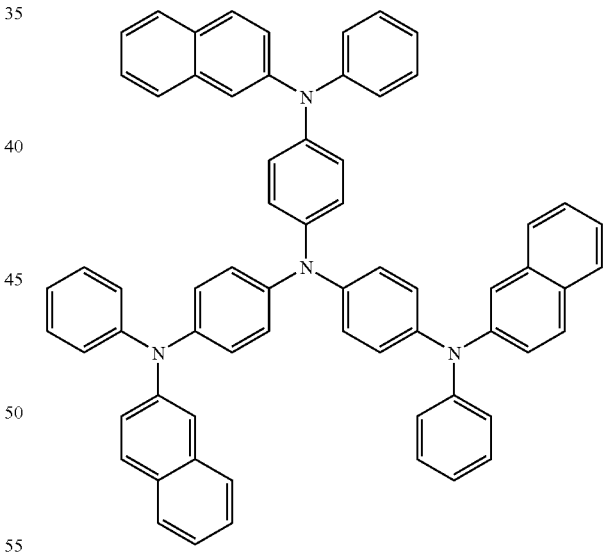

2-TNATA

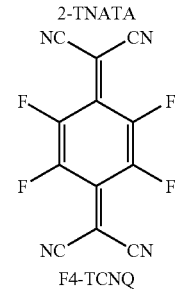

F4-TCNQ

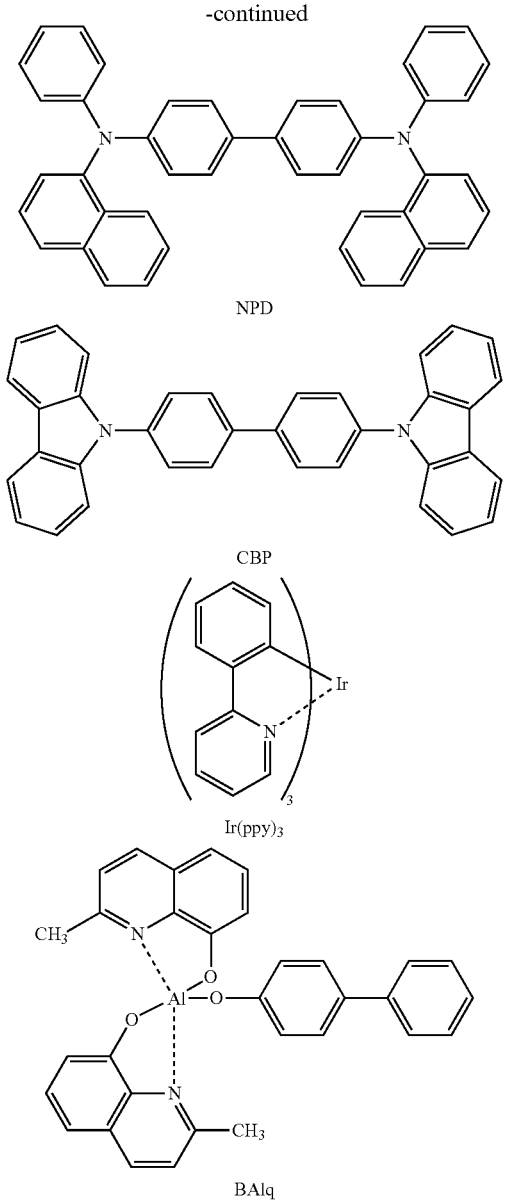

2. Formation of Sealing Layer

Subsequently, a sealing layer having a three-layered structure including SiN, SiON and SiN in this order (total thickness: 7 μm) was formed on the cathode according to a CVD method. This was a layer for suppressing the invasion of oxygen, moisture or the like, and the refractive index of this sealing layer was about 1.7 to 1.9.

3. Formation of Resin Layer

An epoxy resin composition (trade name: DENATITE (ultraviolet curable resin), manufactured by Nagase ChemteX Corporation) was applied on the sealing layer. After the resin composition was dried, a resin layer in a semi-cured state (thickness: 20 μm) was formed by UV irradiation. The refractive index of this epoxy resin layer was about 1.4 to 1.5.

4. Implantation of Light Transmitting Particles

Subsequently, light transmitting particles (material: zinc oxide, refractive index: 1.95, particle diameter: 3 μm) were implanted into the epoxy resin layer in a semi-cured state, using an gas flow conveyance apparatus (a sand blasting machine, manufactured by Fuji Manufacturing Co., Ltd.).

After the particles were implanted, UV irradiation was carried out again to further cure the epoxy resin layer.

After the epoxy resin layer was cured, nitrogen gas was blown to remove residual particles that had not been implanted into the epoxy resin layer. After the removal, the surface of the resin layer was analyzed by observing with a scanning electron microscope, and the light transmitting particles were dispersed uniformly at the surface of the resin layer in a state of being partially embedded. The occupancy with respect to the pixel area was 50%.

5. Provision of Sealing Substrate

Subsequently, the assembly was transferred into a glove box in a nitrogen atmosphere, and a glass substrate which measured 10 mm square and had a thickness of 1 mm, was attached as a sealing substrate to the supporting substrate. A photosensitive epoxy resin adhesive, with glass spacers (diameter: 300 μm) dispersed therein, was applied around the pixels on the supporting substrate of the organic EL element, then the sealing substrate was pressed, and the epoxy resin adhesive was cured using a UV lamp. Thus, an organic EL light emitting device was obtained.

6. Evaluation of Organic EL Device

The anode and the cathode were connected to a power supply, and were implanted with a driving current of 2.5 mA/cm$^2$. The peak intensity of an EL spectrum was measured from the front surface of the organic EL light emitting device, with a luminance meter (model name: CS-1000, manufactured by Konica Minolta Holdings, Inc.).

Example 2

An organic EL light emitting device was produced in the same manner as in Example 1, except that the material of the light transmitting particles was changed to barium titanate (refractive index: 2.4, particle size: 3 μm), and the peak intensity of the EL spectrum was measured.

Comparative Example 1

An organic EL light emitting device was produced in the same manner as in Example 1, except that implantation of light transmitting particles into the epoxy resin layer was not carried out, and the peak intensity of the EL spectrum was measured.

Example 3

When an epoxy resin layer was to be formed on the sealing layer, an epoxy resin to which light transmitting particles (barium titanate) had been added in advance, was applied on the sealing layer, and the light transmitting particles were allowed to settle on the sealing layer. After the particles had settled, the epoxy resin was turned into a resin layer (thickness 20 μm) in a semi-cured state by UV irradiation. Except that the resin layer was formed in this manner, an organic EL light emitting device was produced in the same manner as in Example 2, and the peak intensity of the EL spectrum was measured.

Comparative Example 2

An organic EL element was formed in the same manner as in Example 1, an epoxy resin composition was applied on the sealing layer, and then was sufficiently cured without performing the implantation of light transmitting particles. A mold having convex parts, each of which measured 0.1 μm square, formed on the surface at intervals of 0.1 μm, was prepared, and the mold was heated and pressed on the surface of the resin layer, to thereby form unevenness. After the resin layer was cooled, a sealing substrate was adhered in the same manner as in Example 1 to produce an organic EL light emitting device, and the peak intensity of the EL spectrum was measured.

Comparative Example 3

An organic EL element was formed in the same manner as in Example 1. Barium titanate (particle size: 3 µm) was kneaded into the epoxy resin composition, the resulting mixture was applied on the sealing layer, and immediately thereafter, drying and UV irradiation were carried out to cure the epoxy resin composition. Thus, a resin layer having barium titanate dispersed within the layer was formed on the sealing layer.

In regard to the organic EL light emitting devices obtained in the respective Examples and Comparative Examples, the material and refractive index of the resin layer and the light transmitting particles, and the results of measurement of the peak intensity are shown in the following Table 1. Here, the peak intensities indicated in the Table 1 are the peak intensities of the light emitting devices of the respective Examples and Comparative Examples relative to the peak intensity of the light emitting device of Example 1, which was taken as 1.

Example 4

Figure 11:
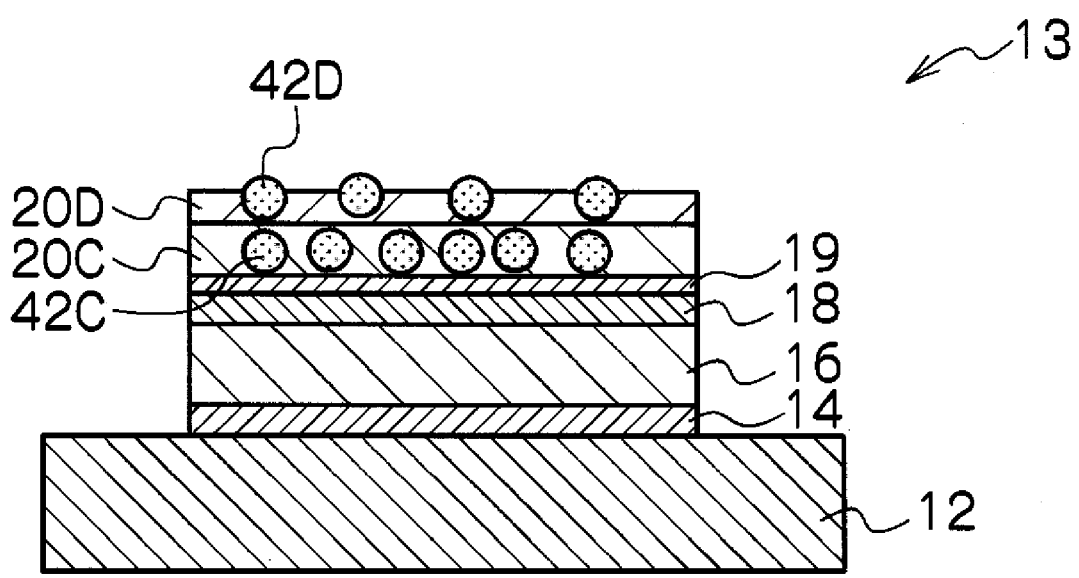
FIG. 11 is a schematic diagram showing a part of the configuration of the top emission organic EL light emitting device produced in Example 4.

A top emission organic EL light emitting device 13 having a configuration as shown in FIG. 11 was produced by the following procedure.

First, an electrode 14, an organic layer 16, and a translucent electrode 18 were sequentially formed on a substrate 12 using the same materials and the same film forming method as those used in Example 1, and then a sealing layer 19 was formed.

Subsequently, an epoxy resin to which light transmitting particles (zinc oxide, particle size: 3 µm) 42C had been added in advance, was applied on the sealing layer 19, and then the light transmitting particles 42C were allowed to settle on the sealing layer 19. After the particles had settled, UV irradiation was carried out to obtain a first resin layer 20C (thickness 3 µm) in a completely cured state. Furthermore, an epoxy resin, to which light transmitting particles 42D similar to the light transmitting particles (zinc oxide) 42C had been added in advance, was applied on the cured first resin layer 20C at a thickness of 1.5 µm. After the coating, UV irradiation was carried out again, and the epoxy resin was completely cured, to form a second resin layer 20D.

Since the particle size of the light transmitting particles 42D contained in the second resin layer 20D is 3 µm, each particle 42D in the second resin layer 20D is such that about ½ of the volume (surface area) is exposed from the second resin layer 20D. Also, since the respective densities of the light transmitting particles 42C and 42D contained in the respective epoxy resins used in the formation of the resin layers 20C and 20D are similar, the proportion of particles 42D, which have about ½ of the volume of each particle exposed, of the particles 42C and 42D contained in the entire resin layers 20C and 20D, is about 33.3%.

Except that the resin layers 20C and 20D were formed in this manner, an organic EL light emitting device was produced in the same manner as in Example 3, and the peak intensity of the EL spectrum was measured.

Example 5

An organic EL light emitting device was produced in the same manner as in Example 4, except that the resin layers 20C and 20D were formed as follows.

When an epoxy resin layer (first resin layer) was to be formed on the sealing layer 19, an epoxy resin to which light transmitting particles (zinc oxide, particle size: 3 µm) had been added in advance, was applied on the sealing layer 19, and then the light transmitting particles 42C were allowed to settle on the sealing layer 19. After the particles had settled, UV irradiation was carried out to obtain a first resin layer 20C (thickness 5.5 µm) in a completely cured state. Furthermore, an epoxy resin, to which light transmitting particles 42D similar to the light transmitting particles (zinc oxide) 42C had been added in advance, was applied on the cured first resin layer 20C at a thickness of 1.5 µm. After the coating, UV irradiation was carried out again, and the epoxy resin was completely cured, to form a second resin layer 20D.

Similarly to the Example 4, the particles 42D are partially embedded such that about ½ of the volume of each particle is exposed from the second resin layer 20D, and the proportion of the particles 42D, which have about ½ of the volume of each particle exposed, of the particles 42C and 42D contained in the entire resin layers 20C and 20D, is about 21.4%.

Except that the resin layers were formed in this manner, an organic EL light emitting device was produced in the same manner as in Example 4, and the peak intensity of the EL spectrum was measured.

Example 6

A bottom emission organic EL light emitting device 15 having a configuration as shown in FIG. 12 and emitting light from the side of the supporting substrate 12, was produced by the following procedure.

First, on a supporting substrate 12 (material: glass, 20 mm square), an ITO anode was formed as a first electrode 14 at a thickness of 100 nm, in a striped shape with a width of 2 mm.

The anode 14 was formed, and then partition walls (not shown) were patterned by photolithography.

Subsequently, the substrate 12 was mounted on a substrate holder in a vacuum deposition apparatus, with a mask (having 5 mm square openings) disposed thereon such that the areas where an organic layer 12 was to be formed were exposed, and then the interior of the apparatus was evacuated to a degree of vacuum of $5 \times 10^{-5}$ Pa.

A hole injection layer was formed on the anode 14, and then co-deposition was carried out using 2-TNATA and F4-TCNQ as a first hole transport layer, such that the proportion of F4-TCNQ would be 1.0% by mass relative to 2-TNATA, to thus form the hole injection layer at a thickness of 160 nm.

Subsequently, NPD (N,N'-dinaphthyl-N,N'-diphenyl-[1,1'-biphenyl]-4,4'-diamine) was formed as a second hole transport layer at a thickness of 10 nm.

After the second hole transport layer was formed, co-deposition was carried out using CBP (4,4'-dicarbazole-biphenyl) and Ir(ppy)$_3$ (tris(2-phenylpyridine)iridium(III)) such that the proportion of Ir(ppy)$_3$ would be 5% by mass relative to the CBP, to thus form a light emitting layer at a thickness of 30 nm.

Subsequently, BAlq (aluminum(III) bis(2-methyl-8-quinolinato)-4-phenylphenolate) was formed as an electron transport layer at a thickness of 40 nm.

On the electron transport layer, a LiF film was further laminated at a thickness of 1 nm, and then Al was formed as a second electrode 18 at a thickness of 100 nm, in a striped shape with a width of 2 mm, to intersect with the anode. Thus, pixels of the organic EL element, each of which measured 2 mm square, were produced.

Subsequently, the obtained light emitting laminate was placed inside a glove box which had been purged with argon gas, and a photosensitive epoxy resin adhesive 24, with glass spacers (diameter: 300 μm) dispersed therein, was applied around the pixels on the supporting substrate 12 of the organic EL element. Then, a sealing substrate 26 was pressed thereon, and the epoxy resin adhesive 24 was cured using a UV lamp.

An epoxy resin composition was applied in the same manner as in Example 1, on the surface of the supporting substrate at the side opposite to the first electrode (the side opposite to the organic EL element laminate side), and UV irradiation was carried out to form a resin layer (thickness: 20 μm) in a semi-cured state. Light transmitting particles 42A and 42B (material: zinc oxide, refractive index: 1.95, particle size: 3 μm) were implanted into the epoxy resin layer in a semi-cured state, and UV irradiation was carried out again to further cure the epoxy resin layer. After the curing, nitrogen gas was blown to remove residual particles that had not been implanted into the epoxy resin layer 20E.

A bottom emission organic EL light emitting device was produced as above, and the peak intensity of the EL spectrum was measured.

Example 7

A bottom emission organic EL light emitting device was produced in the same manner as in Example 6, except that the material of the light transmitting particles was changed to barium titanate (refractive index: 2.4, particle size: 3 μm), and the peak intensity of the EL spectrum was measured.

Comparative Example 4

Figure 13:
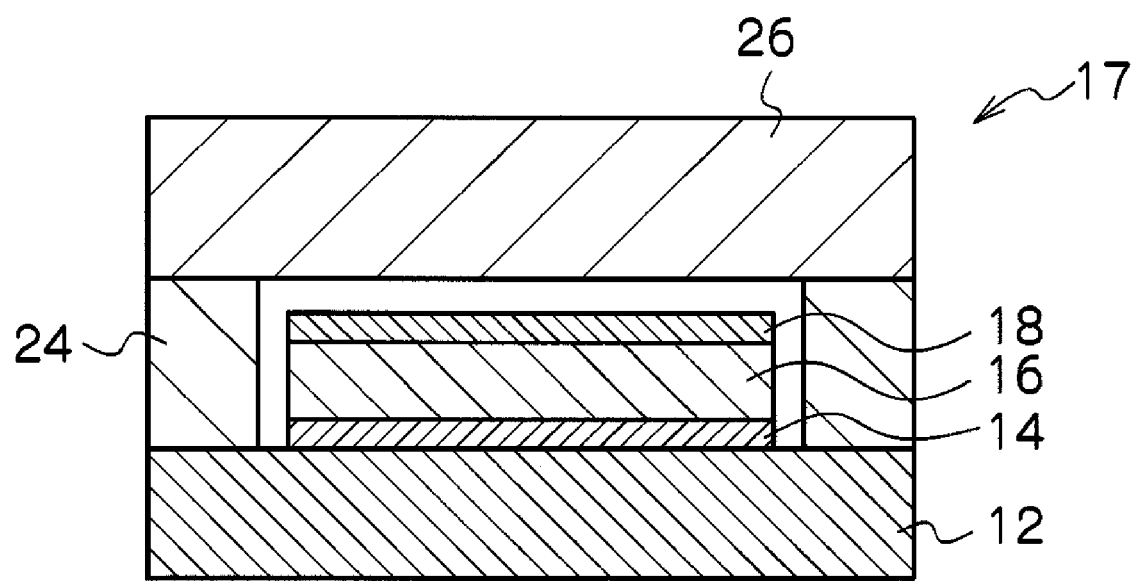
FIG. 13 is a schematic diagram showing a part of the configuration of the bottom emission organic EL light emitting device produced in Comparative Example 4.

A bottom emission organic EL light emitting device 17 having a configuration as shown in FIG. 13 was produced in the same manner as in Example 6, except that formation of an epoxy resin layer and implantation of light transmitting particles were not carried out, and the peak intensity of the EL spectrum was measured.

Example 8

An organic EL light emitting device was produced in the same manner as in Example 4, except that the resin layers 20C and 20D were formed as follows.

An epoxy resin to which light transmitting particles (zinc oxide, particle size: 3 μm) 42C had been added in advance, was applied on the sealing layer 19, and the light transmitting particles 42C were allowed to settle on the sealing layer 19. After the light transmitting particles had settled, UV irradiation was carried out to form a first resin layer 20C (thickness 3 μm) in a completely cured state. Furthermore, an epoxy resin, to which light transmitting particles 42D similar to the light transmitting particles (zinc oxide) 42C had been added in advance, was applied on the cured first resin layer 20C at a thickness of 2.5 μm. After the coating, UV irradiation was carried out again, and the epoxy resin was completely cured, to form a second resin layer 20D.

Since the particle size of the light transmitting particles 42D contained in the second resin layer 20D is 3 μm, most of the respective particles 42D in the second resin layer 20D are such that the part of the particle exposed from the second resin layer 20D is ¼ or less of the volume (surface area) thereof. Furthermore, since the respective densities of the light transmitting particles 42C and 42D contained in the respective epoxy resins used in the formation of the resin layers 20C and 20D are similar, the proportion of the particles 42D, which have a portion (about ¼ or less of the volume) of each particle exposed, of the particles 42C and 42D contained in the entire resin layers 20C and 20D, is about 33.3%.

Except that the resin layers 20C and 20D were formed in this manner, an organic EL light emitting device was produced in the same manner as in Example 4, and the peak intensity of the EL spectrum was measured.

Example 9

An organic EL light emitting device was produced in the same manner as in Example 4, except that the resin layers 20C and 20D were formed as follows.

An epoxy resin to which light transmitting particles (zinc oxide, particle size: 3 μm) 42C had been added in advance, was applied on the sealing layer 19, and the light transmitting particles 42C were allowed to settle on the sealing layer 19. After the light transmitting particles had settled, UV irradiation was carried out to form a first resin layer 20C (thickness 3 μm) in a completely cured state. Furthermore, an epoxy resin to which light transmitting particles 42D similar to the light transmitting particles (zinc oxide) 42C had been added in advance, was applied on the cured first resin layer 20C at a thickness of 0.5 μm. After the coating, UV irradiation was carried out again, and the epoxy resin was completely cured, to form a second resin layer 20D.

Since the particle size of the light transmitting particles 42D contained in the second resin layer 20D is 3 μm, most of the particles 42D in the second resin layer 20D are such that the part of the particle exposed from the second resin layer 20D is ¾ or more of the volume (surface area) thereof. Furthermore, since the respective densities of the light transmitting particles 42C and 42D contained in the respective epoxy resins used in the formation of the resin layers 20C and 20D are similar, the proportion of the particles 42D, which have a portion (about ¾ or more of the volume) of each particle exposed, of the particles 42C and 42D contained in the entire resin layers 20C and 20D, is about 33.3%.

Except that the resin layers 20C and 20D were formed in this manner, an organic EL light emitting device was produced in the same manner as in Example 4, and the peak intensity of the EL spectrum was measured.

TABLE 1

| | Resin layer | | Light transmitting particles | | Peak intensity of EL spectrum |
|---|---|---|---|---|---|
| | Material | Refractive index | Material | Refractive index | |
| Example 1 | Epoxy resin | 1.4-1.5 | ZnO | 1.95 | 1.00 |
| Example 2 | Epoxy resin | 1.4-1.5 | BaTiO$_3$ | 2.40 | 1.15 |
| Example 3 | Epoxy resin | 1.4-1.5 | BaTiO$_3$ | 2.40 | 1.35 |
| Comparative Example 1 | Epoxy resin | 1.4-1.5 | — | — | 0.50 |
| Comparative Example 2 | Epoxy resin | 1.4-1.5 | — | — | 0.65 |
| Comparative Example 3 | Epoxy resin | 1.4-1.5 | BaTiO$_3$ | 2.40 | 0.70 |
| Example 4 | Epoxy resin | 1.4-1.5 | ZnO | 1.95 | 1.38 |
| Example 5 | Epoxy resin | 1.4-1.5 | ZnO | 1.95 | 1.08 |
| Example 6 | Epoxy resin | 1.4-1.5 | ZnO | 1.95 | 1.20 |
| Example 7 | Epoxy resin | 1.4-1.5 | BaTiO$_3$ | 2.40 | 1.35 |
| Comparative Example 4 | Epoxy resin | 1.4-1.5 | — | — | 0.75 |
| Example 8 | Epoxy resin | 1.4-1.5 | ZnO | 1.95 | 1.07 |
| Example 9 | Epoxy resin | 1.4-1.5 | ZnO | 1.95 | 1.08 |

The light emitting devices of Examples 1 and 2 have high peak intensities and enhanced light extraction efficiencies, as compared to the light emitting devices of Comparative Examples 1 to 3. In particular, the device of Example 2 in which the refractive index of the light transmitting particles is larger than the refractive index of the resin layer, has greater peak intensity and higher enhancement of light extraction efficiency, as compared to the device of Example 1 in which the refractive index of the light transmitting particles is smaller than the refractive index of the resin layer.

In Example 3 where the light transmitting particles are in contact with the sealing layer, which is adjacent to the resin layer, the peak intensity is much higher, and the light extraction efficiency is further enhanced.

In Examples 4 and 5, some of the entire light transmitting particles are partially embedded in the resin layer at a volume proportion of ¼ to ¾ (about ½) of each particle, but particularly in the case of Example 4 where 30% or more of the entire particles are partially embedded in the resin layer at a volume proportion of ½ of each particle, the peak intensity has further increased.

Furthermore, also in the bottom emission type elements which emit light from the substrate side as in the case of Examples 6 and 7, an effect of enhancing the light extraction efficiency, which is equal to or greater than that obtainable in Examples 1 to 5, is obtainable.

In Examples 8 and 9, of the entire particles, the proportion of the particles having a part of each particle exposed is 30% or more, and the light extraction efficiency is enhanced. However, the exposed part (volume ratio) of each particle is ¼ or less in Example 8, and ¾ or more in Example 9. The light extraction efficiency in Example 4 is higher than those in Examples 8 and 9.

The invention has been described thus far, but the invention is not intended to be limited to the above-described exemplary embodiments and Examples.

For example, the light emitting device according to the invention may be used as a backlight for liquid crystal displays, a light source for image forming apparatuses, or the like, and may also be used as a display device after pixels are formed by subjecting the light emitting layer to RGB patterning. Also, in the above-described exemplary embodiments, descriptions have been given concerning the case of forming an organic EL layer as the EL layer, but the applications are not limited to these. For example, the invention may also be applied to a light emitting device in which a light emitting layer of ZnS:Mn, BaAl$_2$S$_4$:Eu or the like is formed, and an inorganic EL layer including a dielectric layer of TiO$_2$, Ta$_2$O$_5$, BaTiO$_3$ or the like is formed between the light emitting layer and at least one of electrodes.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
    a supporting substrate,
    a first electrode disposed on the supporting substrate,
    an electroluminescent layer disposed on the first electrode and including at least a light emitting layer,
    a second electrode disposed opposite to the first electrode, with the electroluminescent layer interposed therebetween;
    a sealing layer disposed on the second electrode;
    a resin layer disposed on the sealing layer; and
    light transmitting particles scattered in the resin layer,
    at least a portion of the light transmitting particles being scattered such that a part of each of the scattered particles is embedded in a surface of the resin layer at the side at which light emitted from the light emitting layer is extracted from the resin layer, wherein
    the refractive index of the light transmitting particles is higher than the refractive index of the resin layer,
    the refractive index of the resin layer is lower than the refractive index of the sealing layer, and
    a portion of the light transmitting particles, that are scattered in areas other than the surface of the resin layer on the side at which light is extracted from the resin layer, is in contact with the sealing layer.

2. The light emitting device of claim 1, wherein 30% or more of the light transmitting particles are partially embedded in the resin layer, and only ¼ to ¾ of the volume of each partially embedded particle is embedded in the resin layer.

3. The light emitting device of claim 1, wherein 30% or more of the light transmitting particles that are scattered in the resin layer are in contact with the sealing layer.

4. The light emitting device of claim 1, wherein the resin layer also serves as a solid sealing layer.

5. The light emitting device of claim 1, further comprising a sealing substrate.

* * * * *